United States Patent [19]
Wielopolski et al.

[11] Patent Number: 5,814,990
[45] Date of Patent: Sep. 29, 1998

[54] METHOD FOR COMPENSATING DC VOLTAGE OFSETS IN MEASUREMENT CHANNELS FOR NUCLEAR MAGNETIC RESONANCE SIGNALS AND ARRANGEMENT FOR THE IMPLEMENTATION OF THE METHOD

[75] Inventors: Piotr Wielopolski, Rotterdam, Netherlands; Franz Schmitt, Erlangen, Germany

[73] Assignee: Siemens Aktiengesellschaft, Munich, Germany

[21] Appl. No.: 847,718

[22] Filed: Apr. 28, 1997

[30] Foreign Application Priority Data

Apr. 25, 1996 [DE] Germany ............ 196 16 552.0

[51] Int. Cl.$^6$ .................................................. G01R 33/54
[52] U.S. Cl. ............................ 324/307; 324/322
[58] Field of Search ....................... 324/300, 307, 324/309, 312, 318, 322

[56] References Cited

U.S. PATENT DOCUMENTS

| | | | |
|---|---|---|---|
| 4,862,081 | 8/1989 | Denison | 324/307 |
| 5,087,880 | 2/1992 | Bruder et al. | |
| 5,097,210 | 3/1992 | Requardt et al. | |
| 5,170,121 | 12/1992 | Ogikubo et al. | 324/307 |
| 5,531,223 | 7/1996 | Hatanka | |
| 5,726,571 | 3/1998 | Guclu et al. | 324/322 |

FOREIGN PATENT DOCUMENTS 0 076 054  4/1983  European Pat. Off. .

OTHER PUBLICATIONS

"A Real–Time NMR Image Reconstructing System Using Echo–Planar Imaging and A Digital Signal Processor," Kose et al., Meas. Sci. Technol., vol. 3 (1992), pp. 1161–1165.

*Primary Examiner*—Sandra L. O'Shea
*Assistant Examiner*—Michael Eisenberg

[57] ABSTRACT

In a nuclear magnetic resonance tomography apparatus wherein image information are sampled in time measurement windows with a sampling grid that is not equidistant in time and are digitized, for D.C. offset compensation in at least one measurement window, the output signal of the measurement channel is sampled without a nuclear magnetic resonance signal, is digitized, and the offset data acquired in this way are stored in an offset vector. The n offset data stored in the offset vector are subtracted from the image raw data that are acquired per measurement window and allocated chronologically in the sampling grid.

7 Claims, 6 Drawing Sheets

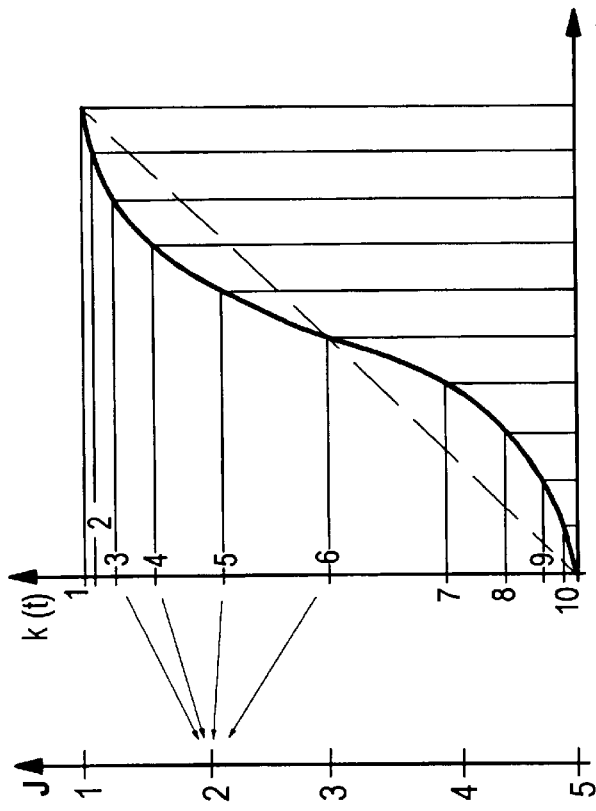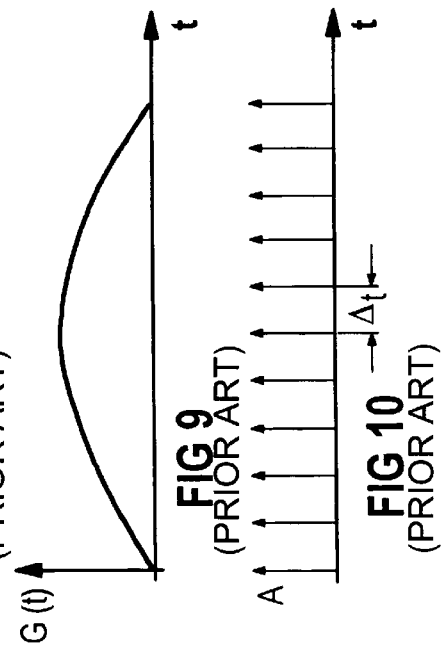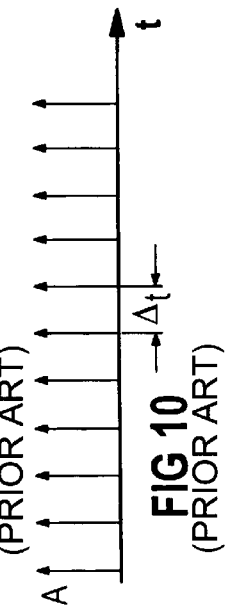
FIG 8 (PRIOR ART)
FIG 9 (PRIOR ART)
FIG 10 (PRIOR ART)
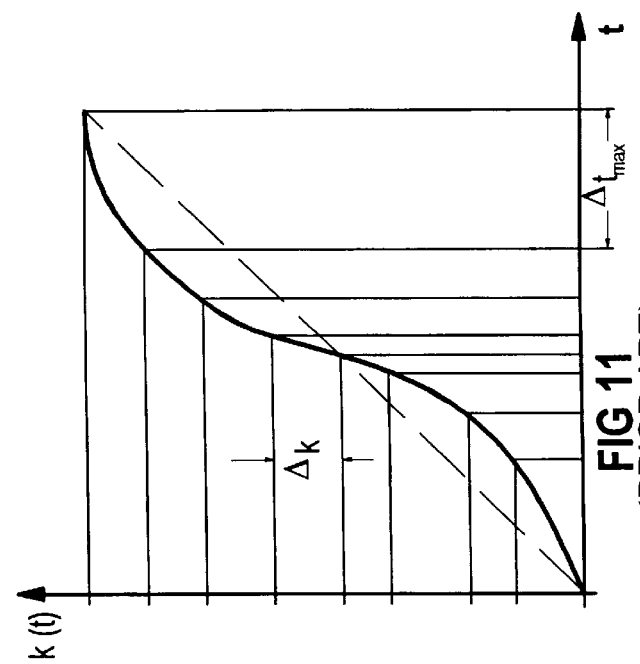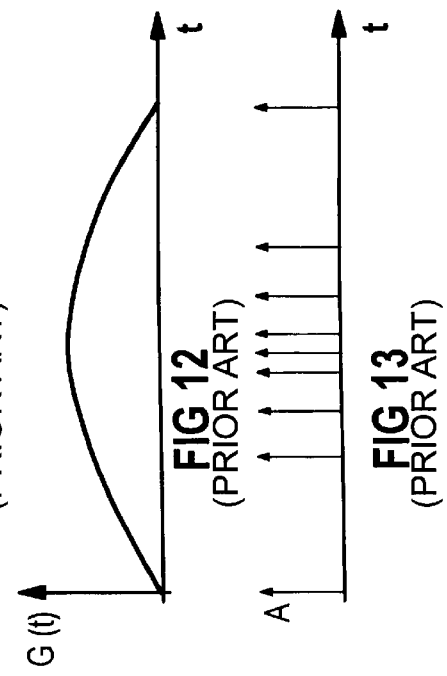
FIG 11 (PRIOR ART)
FIG 12 (PRIOR ART)
FIG 13 (PRIOR ART)

METHOD FOR COMPENSATING DC VOLTAGE OFSETS IN MEASUREMENT CHANNELS FOR NUCLEAR MAGNETIC RESONANCE SIGNALS AND ARRANGEMENT FOR THE IMPLEMENTATION OF THE METHOD

BACKGROUND OF THE INVENTION

1. Field of the Invention

The present invention is directed to a method and apparatus for compensating for D.C. voltage offsets which arise in measurement channels in nuclear magnetic resonance tomography.

2. Description of the Prior Art

Demodulated nuclear magnetic resonance signals can exhibit a D.C. voltage offset given hardware that is not ideal. This offset can have various causes. For example, it can appear in pre-amplifiers and in the demodulator. An offset can also occur in the digitalization due to incomplete calibration of the analog-to-digital converter. In the time between two signal samplings, further, a charge can build up in parasitic capacitances, for example within the circuit of the analog-to-digital converter or a coupling capacitance between pre-amplifier and analog-to-digital converter.

An artifact that is expressed in an individual intensity spike that can be higher or lower than the nuclear spin density at the location of the spike arises in the reconstructed image due to the D.C. voltage offset. Without further measures, this spike lies in the middle of the image given two-dimensional scanning and lies in the middle of the volume given three-dimensional scanning. Since it is especially disturbing at those locations, known systems generally generate with a phase relation in the radio-frequency excitation alternating by 180°, so that the polarity of arising nuclear magnetic resonance signal likewise alternates; however, the D.C. voltage offset does not. One thus succeeds in shifting the aforementioned artifact to the edge of the observation window, or into a corner of the volume under consideration given three-dimensional scanning, where it is less disturbing.

Compared to the nuclear magnetic resonance signal, the D.C. voltage offset generally exhibits a very low amplitude; under unfavorable conditions, however, its contribution can be significant, namely given poor balancing before the measurement, given poor calibration of the reception channel, and given specific pulse sequences. In detail, the following effects have an especially unbeneficial effect on the offset:

a) A balancing of the receiver is usually implemented before the measuring event. When the game factor is incorrectly set in the reception channel, either the range of the analog-to-digital converter is not fully exploited or the analog-to-digital converter is over-driven.

b) Multiple echos with different signal intensities are acquired in certain MR experiments. Only one amplifier setting for the reception channel is thereby selected for all echos. Only the strong nuclear magnetic resonance signals completely drive the analog-to-digital converter. Weaker nuclear magnetic resonance signals are more highly affected by the D.C. voltage offset. This can become particularly serious given long EPI (echo planar imaging) sequences wherein the last signal exhibits a far lower amplitude compared to the first signal.

c) Given strong signal differences, the range of dynamics of the received signal may potentially not be adequately acquired with a given plurality of quantization levels of the analog-to-digital converter. EPI sequences with long echo trains are again especially problematical. The contribution of the D.C. voltage offset during each measuring window after the Fourier transformation is proportional to the number of measured lines. Particularly given three-dimensional imaging, the echo trains become so long in what is referred to as the single shot method that an originally small D.C. voltage offset causes a pronounced artifact in the ultimate image.

d) When a data acquisition is implemented with an array of reception coils as disclosed, for example, in U.S. Pat. No. 5,097,210, the D.C. voltage offset of the individual channels constructively superimposes during the generation of a composite image, so that a much larger D.C. voltage arises.

A number of the aforementioned effects can contribute in a combined manner to increasing the D.C. voltage offset.

A correction of the D.C. voltage offset is implemented in systems already in operation. Samples for the output voltage of the reception channel are thereby acquired within an individual measurement window with no nuclear magnetic resonance signal pending, this acquisition occurring separately for real part and the imaginary part of the reception system. The number of acquired samples within the sampling window corresponds to the number of values of a nuclear magnetic resonance signal sampled for the acquisition of the raw data. The samples are separately averaged for imaginary part and real part, so that two offset correction values that are stored are ultimately obtained. Each of these values corresponds to the D.C. voltage offset for the real part or the imaginary part. More measured values corresponding to the number of reception channels are collected given an array coil arrangement.

The offset values acquired according to the above-recited method are subtracted in the following acquisition of the raw data for the image acquisition.

In this method, a nearly complete offset correction is only achieved when the D.C. voltage offset for all measurement windows as well as within a measurement window is constant. It has been shown, however, that the latter is only the case when the sampling of the measured values ensues equidistantly in time within a measurement window. It can be advantageous, however, to implement a non-equidistant sampling in the time domain given gradients that vary within the measurement window, so that an equidistant sampling in the k-space is present. In this case, however, the D.C. voltage offset can vary over the measurement window.

SUMMARY OF THE INVENTION

An object of the present invention is to provide a method for the compensation of D.C. voltage offsets such that an effective offset correction is possible even given a non-equidistant sampling grid in the time domain.

The above object is achieved in accordance with the principles of the present invention in a method and an apparatus for compensating D.C. voltage offsets in a measurement channel for nuclear magnetic resonance signals of a magnetic resonance imaging apparatus, wherein the signals are sampled n-times in chronological measurement windows with a sampling grid that is non-equidistant in the time domain and the samples are digitized, so that n raw data entries are acquired per measurement window, with the output signal of the measurement channel being sampled and digitized in at least one measurement window without the nuclear magnetic resonance signal and within the same sampling grid as in the acquisition of the information and this output signal is also digitized, with the resulting n offset data entries acquired in this manner being stored as an offset vector. The data contained in the offset vector are subtracted from the chronologically allocated raw data entries acquired in the measurement window.

The possible time-dependency of the D.C. voltage offset within a measurement window is thereby acquired and taken into consideration in the offset correction.

DESCRIPTION OF THE DRAWINGS

FIGS. 8 through 10 show the position of the samples in the k-space given chronologically equidistant sampling under a sinusoidal read-out gradient.

FIGS. 11 through 13 show the sampling points in the time domain given equidistant sampling in the k-space under a sinusoidal read-out gradient.

DESCRIPTION OF THE PREFERRED EMBODIMENTS

Figure 1:
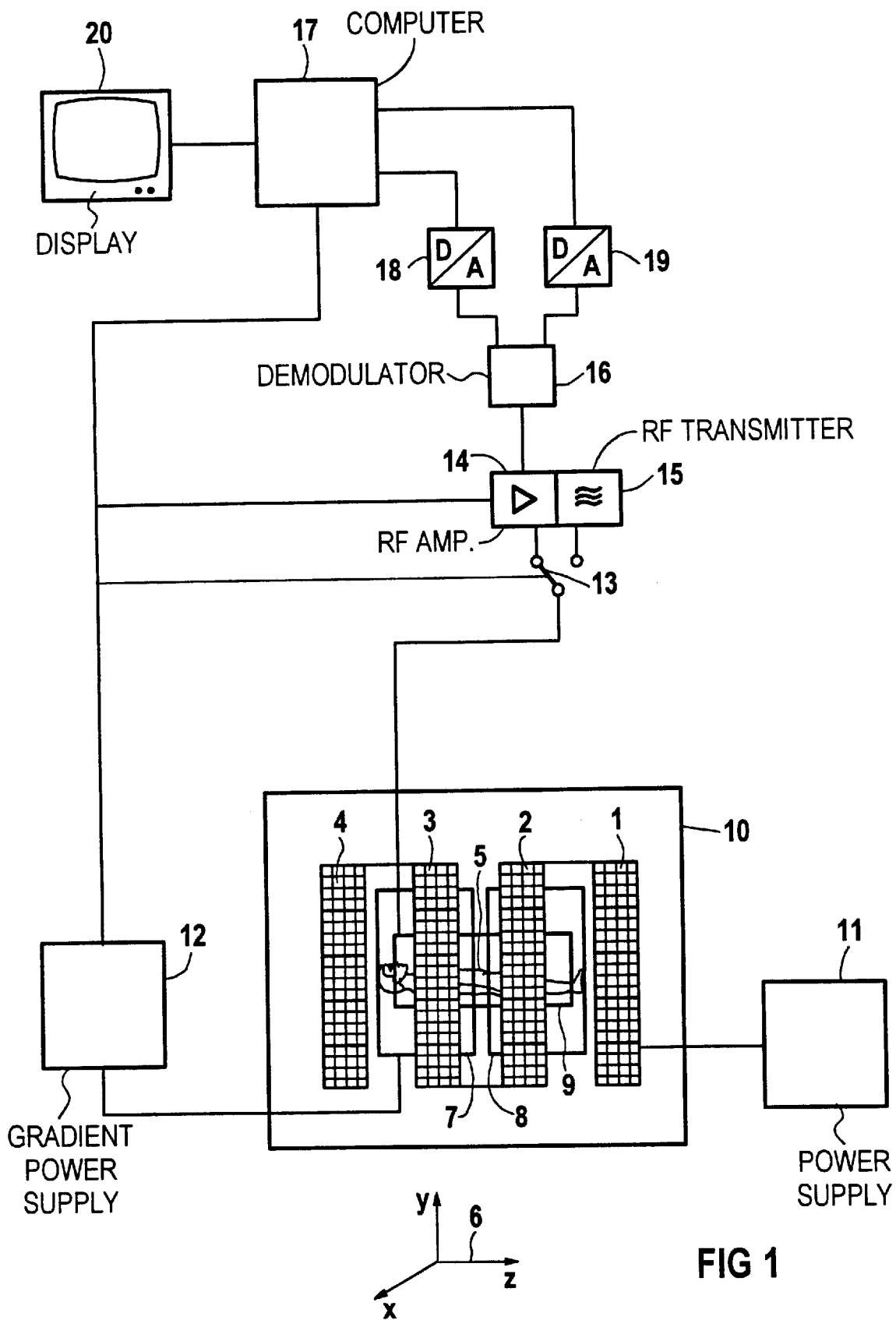
FIG. 1 is a block diagram of a conventional MR system for explaining the problem to which the invention is directed.

For explaining the invention, the basic components of a nuclear magnetic resonance tomograph are shown with reference to FIG. 1. The coils 1 through 4 generate a basic magnetic field $B_0$ in which, given application for medical diagnostics, the body 5 of a patient to be examined is located. Gradient coils are also allocated thereto, these being provided for generating independent, mutually perpendicular magnetic field components of the directions x, y and z according to the coordinate axes 6. For clarity, only the gradient coils 7 and 8 are shown in the Figure, these serving the purpose for generating an x-gradient together with a pair of identical gradient coils lying opposite. The identical y-gradient coils (not shown) lie parallel to the body 5 and above as well as below it; those for the z-gradient field lie transversely to its longitudinal axis at the head end and at the foot end.

The arrangement also contains a radio-frequency coil serving the purpose of generating and picking up the nuclear magnetic resonance signals. A power supply 11 is provided for driving the coils 1 through 4; a gradient power supply 12 is provided for driving the gradient coils 7 and 8 and the other gradient coils. The radio-frequency coil 9 is optionally connected via a switching unit 13 to a signal amplifier 14 or to a radio-frequency transmitter 15. The switching unit 13 enables the switching of the radio-frequency coil 9 to a transmission mode or a reception mode. A phase-sensitive demodulator 16 is connected to the signal amplifier 14 that amplifies the received nuclear magnetic resonance signal. The demodulator 16 has separate outputs for real part and imaginary part of the complex output signal. Real and imaginary part are respectively separately sampled and digitized with digital-to-analog converters 18 and 19. The digitized values are processed in a computer 17 to form an image that is presented on a display 20.

A number of pulse sequences are known for the drive of the radio-frequency units 13, 14, 15 and the gradient coils 7, 8. The fastest pulse sequence currently utilized is the EPI (echo planar imaging) method, as disclosed in European Application 0 076 054. Since gradients that are not constant within a measurement window are often employed in the EPI method, and thus the problem of non-constant D.C. voltage offset initially set forth occurs, an example of the EPI method shall be explained in terms of its basic characteristics below with reference to FIGS. 2 through 7.

Figure 2:
FIGS. 2 through 7 show an EPI sequence with sinusoidal read-out gradient, likewise for explaining a problem to which the invention is directed.
Figure 3:

Under a frequency-selective radio-frequency pulse RF according to FIG. 2, a slice of the examination subject is first excited given simultaneous application of a slice-selection gradient SS. Subsequently, a negative slice-selection gradient pulse SS- is activated for rephasing the dephasing caused by the positive part of the slice-selection gradient SS, as are a pre-phasing gradient PCV in a phase-encoding direction according to FIG. 4 or 5. Finally, a read-out gradient RO with alternating operational sign is activated according to FIG. 6, whereby an echo signal that is respectively sampled in a measurement window AQ arises under every sub-pulse due to rephasing. The amplitude of echo signals S decreases with the spin-grid relaxation time T2, so that very small nuclear magnetic resonance signals S on which the D.C. voltage offsets have a greater effect are obtained at the end given long echo trains.

For optimal use of the measuring time, one attempts to obtain as many nuclear magnetic resonance signals as possible after one excitation in this method before the signal amplitude has dropped too greatly due to the spin-grid relaxation time T2. In the extreme case, all nuclear magnetic resonance signals required for a complete imaging are read out after one excitation (single shot method). This, however, assumes that the read-out gradient RO is switched extremely fast. On thereby quickly encounters limits with the conventional square-wave pulses since extremely steep leading and trailing edges are required. Due to the inductance of the gradient coils, high voltage loads of the gradient amplifier and of the gradient coils would arise. Moreover, steep leading and trailing edges induce currents in the examination subject that can lead to physiological stimulation up to and including the sensation of pain and must therefore be kept within narrow limits for safety reasons. A sinusoidal curve of the read-out gradient RO is therefore preferred for fast EPI methods, since such a curve, given comparatively little outlay, can be generated with a resonant circuit in which the gradient coils form the resonant inductance. The read-out gradient, however, is no longer a constant in the measurement window AQ. This problem shall be discussed in detail below.

Figure 4:
Figure 5:
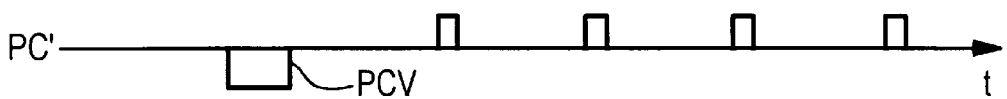
Figure 6:
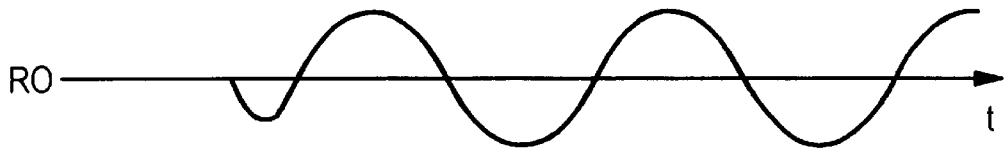
Figure 7:
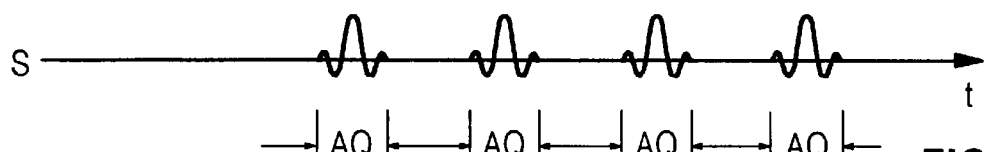

For a phase-encoding of the nuclear magnetic resonance signals, a phase-encoding gradient PC can remain activated during the entire read-out phase according to FIG. 4, so that the phase of the nuclear magnetic resonance signals continuously rises. As shown in FIG. 5, however, a phase-encoding "blip" PC' can be activated before each nuclear magnetic resonance signal S, this incrementing the phase-encoding by one step at a time.

After the demodulation, each nuclear magnetic resonance signal S is sampled m times in a measurement window AQ; the samples are digitized and entered into one row of a raw data matrix per nuclear magnetic resonance signal. A total of m nuclear magnetic resonant signals with different phase-encoding are acquired, so that a raw data matrix with m rows is ultimately obtained. The raw data matrix can be considered to be a measured data space, a measured data plane in the two-dimensional case being illustrated here. This measured data space is generally referred to as k-space in nuclear magnetic resonance tomography.

The information about the spacial origin of the signal contributions needed for the image generation is encoded in the phase factors, whereby the relationship between the location space (i.e., the image) and the k-space mathematically exits via a two-dimensional Fourier transformation. Valid is:

$$S(k_x, k_y) = \iint p(x, y) e^{i(k_x x + k_y y)} dx dy \quad (1)$$

wherein $$k_x(t) = Y \int_0^t G_x(t') dt' \quad (2)$$

$$k_y(t) = Y \int_0^t G_y(t') dt' \quad (3)$$

When the nuclear magnetic resonance signals are now read out under a non-constant gradient, then an equidistant sampling in the time domain leads to a non-equidistant sampling in the k-space. This is illustrated in FIGS. 8 through 10. The function k(t) derived on the basis of equations 2 and 3 is thereby entered for a non-constant gradient G(t). When a chronologically equidistant measure d value sampling identified by arrows in FIG. 10 is then implemented, then one can see in the illustration of FIG. 8 that distortions in the k-space, namely a non-equidistant sampling grid, occur. If the data acquired in this way were directly subjected to a Fourier transformation, then image artifacts that could not be tolerated would arise therefrom. Given a equidistant sampling in the time domain, the identified measured values must therefore be interpolated onto a equidistant k-space grid, as indicated by arrows in FIG. 8. Further, the number of samplings must satisfy the Nyquist condition. This means a higher sampling rate for non-constant gradients. Demands made on the memory capacity as well as on the calculating capacity thus arise due to the necessary interpolations.

For solving this problem, European Application 0 076 054 proposed a measured value sampling that is not equidistant in the time domain but in the k-space. FIGS. 11 through 13 illustrate this method. In the illustrated case, a sinusoidal read-out gradient G(t) is assumed according to FIG. 11. This leads to the curve of the function k(t) shown in FIG. 11. A points in time for the measured value sampling are then selected such that equidistance derives in the k-space. This is achieved in that the gradient time area remains the same under successive samplings. The maximum spacing of two sampling times $\Delta t_{max} = t_{i+1} - t_i$ must thereby be selected such that the resultant k-space increment Δk is smaller than or equal to the inverse value of the image size Δx, $$\Delta k = Y \int_{ti}^{ti+1} G(t) dt \leq \Delta x^{-1} \quad (4)$$

This is a condition that the sampling theorem requires in order to avoid an under-sampling of the k-space and back-convolutions in the image. Although is method requires an asynchronous trigger generator, the interpolation event is eliminated, and the number of values acquired is the same as actually used in the k-space.

Figure 14:
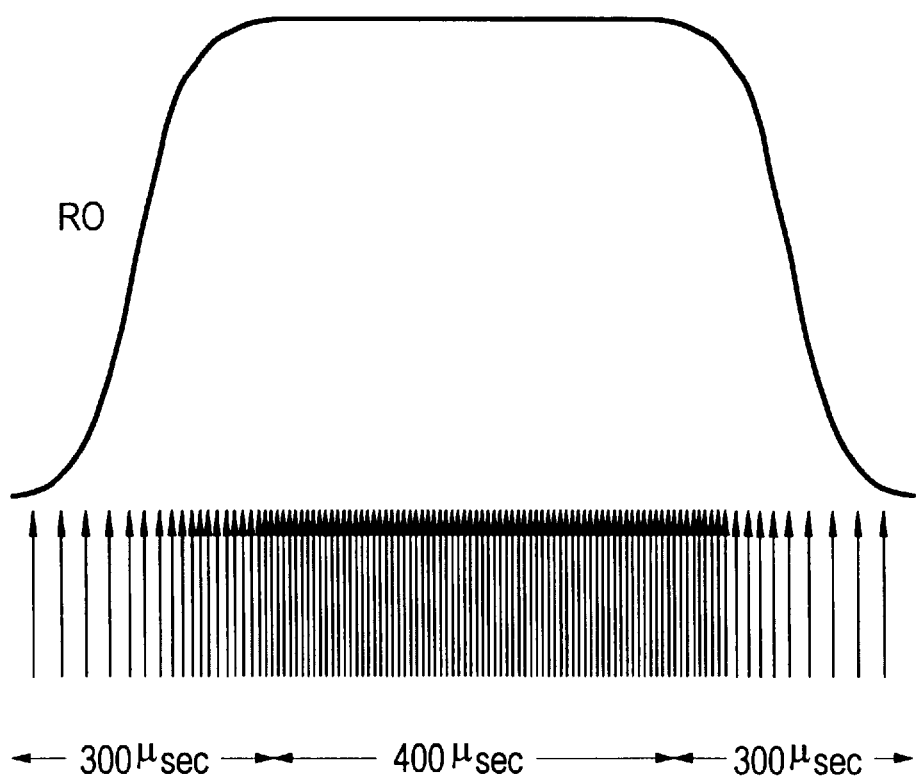
FIG. 14 is an example of a read-out gradient with sinusoidal edges and a constant gradient part as a further example of a gradient curve.
Figure 15:
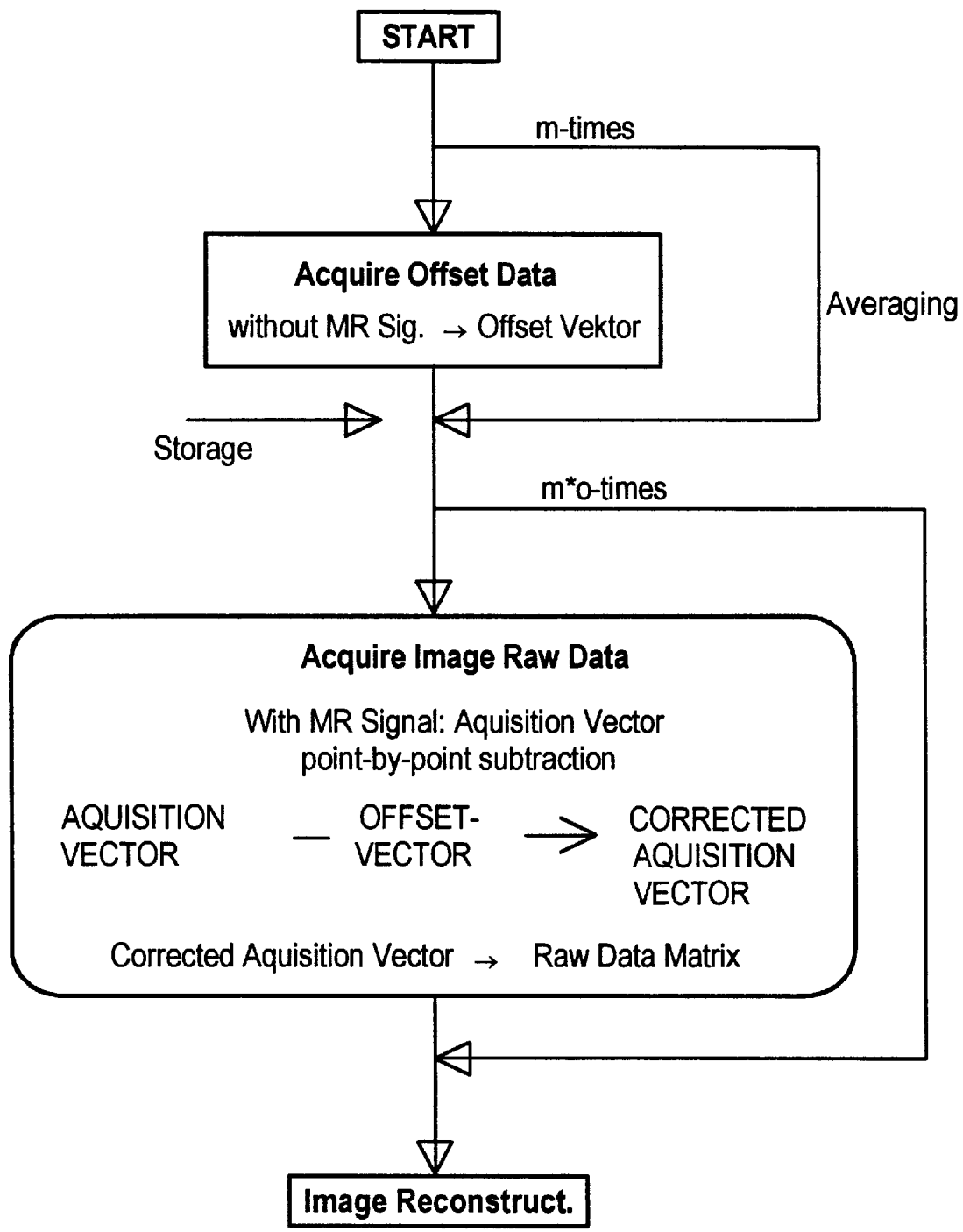
FIG. 15 is a flow chart showing a first exemplary embodiment for the offset correction in accordance with the principles of the present invention.

U.S. Pat. No. 5,087,880 has already noted that this method is suitable not only for sinusoidal gradients but also for arbitrary gradient shapes, for example with sinusoidal leading and trailing edge and straight gradient curve in the middle region. FIG. 14 shows such a gradient shape for the read-out gradient GR together with the sampling sequence deriving therefrom in the time domain.

It can be generally assumed that the D.C. voltage offset is adequately constant from row to row of the collected raw data for an image measurement, i.e., it does not drift. It has been shown, however, that a considerable variation of the D.C. voltage offset is present given a chronologically non-equidistant sampling rate within a measurement windows, i.e., within a raw data row. Since the influence of the D.C. voltage offset on the signal increases with decreasing signal amplitude, this variation is also especially disturbing for the last signals of a long signal train after an excitation. It has been shown given the gradient pulse shape of FIG. 14 that the D.C. voltage offset in the constant part of the read-out gradient pulse is rather constant, i.e., given a constant sampling in the time domain. By contrast, the D.C. voltage offset oscillates in the region of the ramps, where, thus, a non-equidistant sampling in the time domain is present. When the oscillation of the D.C. voltage offset is not taken into consideration and a constant D.C. voltage offset is assumed for the compensation in a conventional way, the offset-caused artifacts are not completely eliminated.

In the method disclosed herein, the curve of the D.C. voltage offset within the measurement window from sampling point to sampling point is therefore taken into consideration in order to reduce the effects of the variation of the D.C. voltage offset. To that end, the output signal of each reception channel (i.e., separately for real part and imaginary part) is sampled n times in a measurement window at the start of the measurement, and the n measured values acquired in this way are stored in an offset vector having the length n. The number of samples n in a measurement window thereby corresponds to the number of samples n in the following image measurement. This procedure is implemented m times in order to obtain reliable measured values for the curve of the D.C. voltage offset within a measurement window (or within a raw data row). By averaging over the samples identically positioned in the m measurement windows, one obtains an averaged offset vector having the length n, this being obtained separately for the two reception channels allocated to the real part and to the imaginary part.

An image measurement that is executed, for example, on the basis of a sequence according to FIGS. 2 through 7 is subsequently implemented. The corresponding nuclear magnetic resonance signal S is sampled n times during each measurement window, so that an acquisition vector having the length n is obtained per nuclear magnetic resonance signal S. The offset vector is subtracted point-by-point from the acquisition vector. A corrected acquisition vector that is stored in a row of a raw data matrix is thus obtained. This procedure is implemented m times for m raw data rows in the case of a two-dimensional data acquisition and is implemented m×o times for m rows and o slices in the case of a three-dimensional data acquisition. The image reconstruction then ensues in a conventional way by two-dimensional or three-dimensional Fourier transformation of the raw data matrix.

One excitation is often not adequate for acquiring the complete image information set, i.e., a number of excitations are implemented for complete sampling of the k-space. This is a so-called "segmented" k-space. As already stated at the outset, excitation pulses with a phase alternating by 180° are usually emitted in this case in order to shift artifacts from the middle of the image to the edge thereof. In this case, the alternating phase relation of the nuclear magnetic resonance signal must also be taken into consideration.

Figure 16:
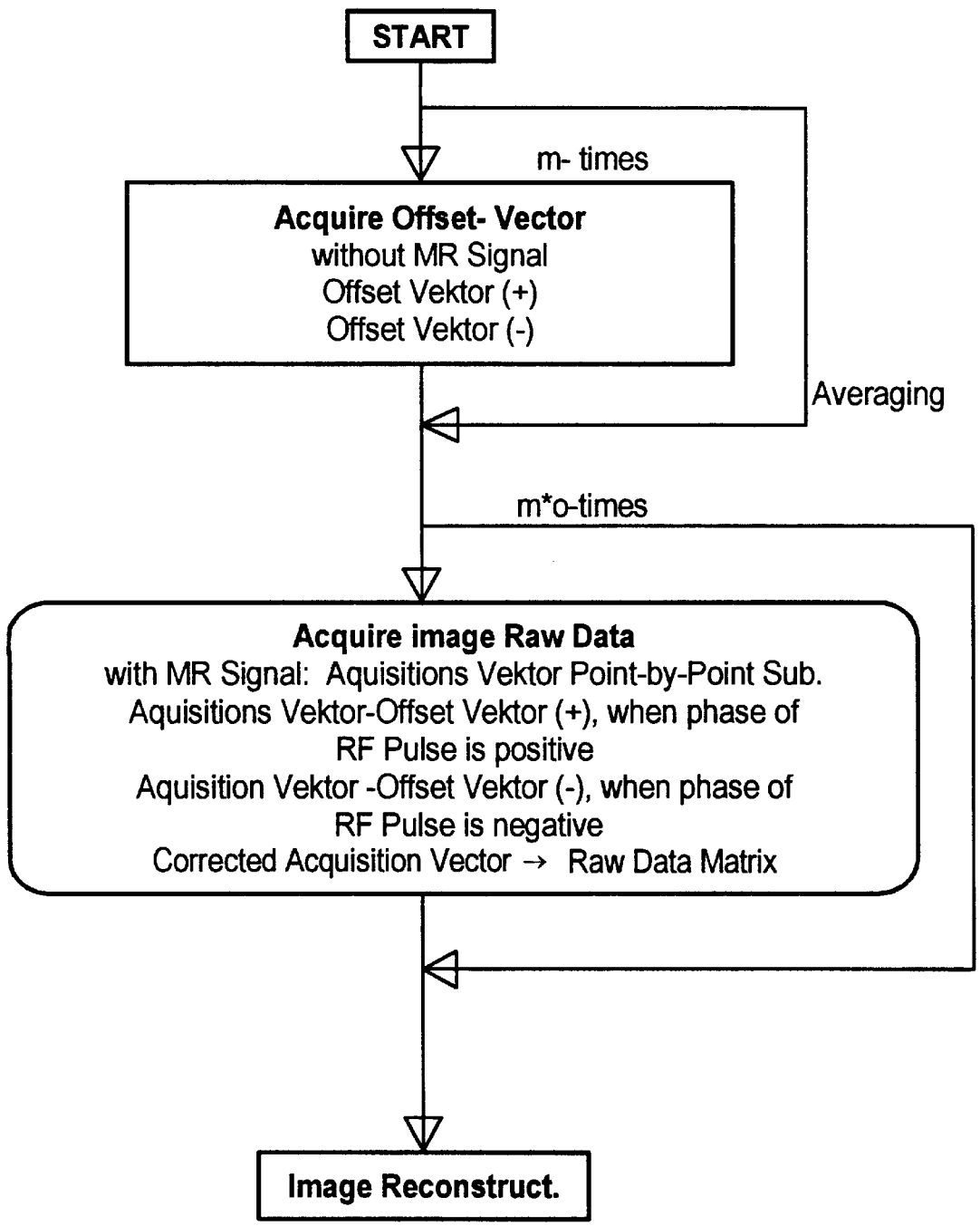
FIG. 16 is a flow chart showing further exemplary embodiment of the offset correction of the invention.

FIG. 16 shows a flow chart for the procedure set forth above. A second offset vector (offset vector −) is thereby stored for each offset vector (offset vector +). In the acquisition of image data, the positive offset vector (offset vector +) is subtracted from the acquisition vector when the allocated radio-frequency pulses emitted in the positive phase direction, and the negative offset vector (offset −) is subtracted when the allocated radio-frequency pulse has a negative phase relation. As in the preceding exemplary embodiment, this procedure is separately implemented for the real part and for the imaginary part of the respective vectors.

With the disclosed method, one also succeeds in achieving a good correction of D.C. voltage offsets in cases wherein the D.C. voltage offset is not constant within a measurement window, for example due to a chronologically non-equidistant sampling. A noticeable improvement can thus be achieved, particularly in the EPI method, where sampling is typically non-equidistantly implemented in the time domain and where, moreover, D.C. voltage offsets have an especially pronounced effect due to long pulse trains with decreasing signal amplitude. The method, however, is also suitable for any other pulse sequence, wherein sampling is carried out non-equidistantly in time due to a non-constant gradient. This, for example, can occur in any pulse sequence wherein the nuclear magnetic resonance signal is also sampled in the region of the leading and trailing edges in order to save measuring time.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for compensating D.C. voltage offsets in a measurement channel for nuclear magnetic resonance signals wherein the signals, for acquiring image information, are sampled n-times in respective chronological measurement windows with a sampling grid that is non-equidistant in the time domain and wherein the resulting samples are digitized to produce n raw data entries per measurement window, said method comprising the steps of:

(a) sampling and digitizing an output signal of said measurement channel in at least one measurement window without a nuclear magnetic resonance signal and with a same sampling grid as for the acquisition of image information, thereby obtaining n offset data entries, and storing said n offset data entries in an offset vector; and (b) subtracting the n offset data stored in the offset vector from the chronologically allocated n raw data entries acquired in the measurement window.

2. A method as claimed in claim 1 comprising repeating step (a) m times to obtain m offset data entries, and sampling said m offset data entries to obtain a new offset vector with n offset data entries averaged m times.

3. A method as claimed in claim 1 further comprising undertaking a phase-sensitive demodulation of said output signal prior to sampling and digitizing in step (a), and thereby obtaining a real part and an imaginary part for each of said raw data entries and said offset vector, and, in step (b) subtracting said real part of said raw data entries from said real part of said offset vector and subtracting said imaginary part of said raw data entries from said imaginary part of said offset vector.

4. A method as claimed in claim 1 comprising the additional steps of:

emitting radio-frequency pulses with an alternating phase relation in order to produce said output signal in said measurement channel, said phase relation alternating from measurement window to measurement window, and producing a respective offset vector for each phase relation.

5. A method as claimed in claim 1 comprising conducting step (a) before each acquisition of a magnetic resonance image.

6. In an apparatus for compensating D.C. voltage offsets in a measurement channel for nuclear magnetic resonance signals wherein the signals, for acquiring image information, are sampled n-times in respective chronological measurement windows with a sampling grid that is non-equidistant in the time domain and wherein the resulting samples are digitized to produce n raw data entries per measurement window, the improvement comprising:

means for sampling and digitizing an output signal of said measurement channel in at least one measurement window without a nuclear magnetic resonance signal and with a same sampling grid as for the acquisition of image information, thereby obtaining n offset data entries, and storing said n offset data entries in an offset vector; and means for subtracting the n offset data stored in the offset vector from the chronologically allocated n raw data entries acquired in the measurement window.

7. The improvement of claim 6 wherein said means for sampling and digitizing the output signal of the measurement channel comprises means for acquiring real and imaginary raw data entries and means for acquiring real and imaginary offset data, and wherein said means for subtracting comprises means for subtracting said real part of said raw data entries from said real part of said offset data and means for subtracting said imaginary part of said raw data entries from said imaginary part of said offset data.

* * * * *